United States Patent
Tsai et al.

(10) Patent No.: US 10,020,210 B2
(45) Date of Patent: Jul. 10, 2018

(54) SYSTEMS AND METHODS FOR MICROWAVE-RADIATION ANNEALING

(71) Applicant: Taiwan Semiconductor Manufacturing Company Limited, Hsinchu (TW)

(72) Inventors: Chun-Hsiung Tsai, Hsinchu County (TW); Zi-Wei Fang, Hsinchu County (TW); Chao-Hsiung Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 15/140,609

(22) Filed: Apr. 28, 2016

(65) Prior Publication Data

US 2016/0240409 A1    Aug. 18, 2016

Related U.S. Application Data

(62) Division of application No. 14/157,588, filed on Jan. 17, 2014, now Pat. No. 9,338,834.

(51) Int. Cl.
*H01L 21/00* (2006.01)
*H05B 6/64* (2006.01)
(Continued)

(52) U.S. Cl.
CPC .... *H01L 21/67115* (2013.01); *H01L 21/2686* (2013.01); *H01L 21/324* (2013.01);
(Continued)

(58) Field of Classification Search
CPC ................................................ H01L 27/67115
(Continued)

(56) References Cited

U.S. PATENT DOCUMENTS 4,714,810 A * 12/1987 Sirkis ................. H05B 6/686
219/693
6,562,448 B1  5/2003 Chamberlain et al.
(Continued)

FOREIGN PATENT DOCUMENTS

KR    20080034199    4/2008
KR    20080067300    7/2008
(Continued)

OTHER PUBLICATIONS

Chinese Office Action; Application No. 201410136921.0; dated Feb. 20, 2017.
(Continued)

*Primary Examiner* — Igwe U Anya
(74) *Attorney, Agent, or Firm* — Haynes and Boone, LLP

(57) ABSTRACT

Systems and methods are provided for annealing a semiconductor structure using microwave radiation. A semiconductor structure is provided. One or more energy-converting materials capable of increasing the semiconductor structure's absorption of microwave radiation are provided. Microwave radiation is applied to the energy-converting materials and the semiconductor structure to anneal the semiconductor structure for fabricating semiconductor devices. First local temperatures associated with one or more first zones of the semiconductor structure are detected. The microwave radiation applied to the energy-converting materials and the semiconductor structure is adjusted based at least in part on the detected first local temperatures.

20 Claims, 6 Drawing Sheets

(51) Int. Cl.
  *H01L 21/67* (2006.01)
  *H01L 21/324* (2006.01)
  *H05B 6/80* (2006.01)
  *H01L 21/268* (2006.01)
  *H01L 21/66* (2006.01)

(52) U.S. Cl.
  CPC ........ *H01L 21/67248* (2013.01); *H01L 22/20* (2013.01); *H05B 6/645* (2013.01); *H05B 6/6435* (2013.01); *H05B 6/80* (2013.01); *H05B 6/806* (2013.01)

(58) Field of Classification Search
  USPC .............................................. 438/5; 219/759
  See application file for complete search history.

(56) References Cited

U.S. PATENT DOCUMENTS

| | | | | |
|---|---|---|---|---|
| 2009/0047204 A1* | 2/2009 | Kim | ...................... | C01B 33/027 |
| | | | | 423/349 |
| 2009/0184399 A1 | 7/2009 | Kowalski et al. | | |
| 2009/0297429 A1 | 12/2009 | Vohra et al. | | |
| 2011/0076786 A1* | 3/2011 | Ahmad | ............. | H01L 21/67248 |
| | | | | 438/5 |
| 2011/0076787 A1* | 3/2011 | Ahmad | ............. | H01L 21/67248 |
| | | | | 438/5 |
| 2011/0143480 A1 | 6/2011 | Hilali et al. | | |
| 2013/0074698 A1* | 3/2013 | Wu | .................... | B01D 46/4263 |
| | | | | 95/283 |
| 2014/0073065 A1 | 3/2014 | Ohno et al. | | |
| 2015/0090708 A1* | 4/2015 | Tanaka | ............. | H01L 21/67115 |
| | | | | 219/695 |
| 2015/0104933 A1 | 4/2015 | Tsai et al. | | |
| 2015/0118866 A1* | 4/2015 | Tsai | ..................... | H05B 6/6491 |
| | | | | 438/795 |
| 2015/0206808 A1* | 7/2015 | Tsai | ..................... | H01L 21/324 |
| | | | | 438/5 |

FOREIGN PATENT DOCUMENTS

KR   20090113313   10/2009
TW   201123997    7/2011

OTHER PUBLICATIONS

Taiwanese Office Action; Application No. 103146002; dated Dec. 8, 2015.
Korean Office Action; Application No. 10-2014-0193510; dated Dec. 1, 2015.

* cited by examiner

SYSTEMS AND METHODS FOR MICROWAVE-RADIATION ANNEALING

CROSS-REFERENCE TO RELATED APPLICATIONS

This application is a divisional application of U.S. patent application Ser. No. 14/157,588, entitled "Systems and Methods for Microwave-Radiation Annealing," filed Jan. 17, 2014, which is incorporated herein by reference in its entirety.

FIELD

The technology described in this patent document relates generally to semiconductor materials and more particularly to processing of semiconductor materials.

BACKGROUND

Semiconductor device fabrication often involves many processes. For example, fabricating a transistor usually includes doping a semiconductor substrate (e.g., adding desired impurities into the substrate) to form epitaxial junctions. Many different approaches may be implemented for doping the substrate, such as ion implantation and epitaxial growth. Dopants (i.e., desired impurities) introduced into the substrate often need to be electrically activated before semiconductor devices can be fabricated on the substrate. The activation of the dopants often involves annealing the substrate to dissolve dopant clusters and transfer the dopant atoms/molecules from interstitial positions into lattice sites of the lattice structure of the substrate.

Under certain circumstances, semiconductor device fabrication involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\varepsilon(\omega)^*$, which depends on the frequency of the electric field:

$$\varepsilon(\omega)^* = \varepsilon(\omega)^* - i\varepsilon(\omega)'' = \varepsilon_0(\varepsilon_r(\omega)' - i\varepsilon_r(\omega)'') \quad (1)$$

where $\Omega$ represents the frequency of the electric field, $\varepsilon(\omega)'$ represents a real component of the complex permittivity (i.e., a dielectric constant), and $\varepsilon(\omega)''$ represents a dielectric loss factor. In addition, $\varepsilon_0$ represents the permittivity of a vacuum, $\varepsilon_r(\omega)'$ represents the relative dielectric constant, and $\varepsilon_r(\omega)''$ represents the relative dielectric loss factor.

Whether a material can absorb the microwave radiation can be characterized using a loss tangent, tan $\delta$:

$$\tan\delta = \frac{\varepsilon''\mu' - \varepsilon'\mu''}{\varepsilon'\mu' + \varepsilon''\mu''} \quad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan\delta = \frac{\varepsilon''}{\varepsilon'} = \frac{\varepsilon_r''}{\varepsilon_r'} \quad (3)$$

Materials with a low loss tangent (e.g., tan $\delta$<0.01) allow microwaves to pass through with very little absorption. Materials with an extremely high loss tangent (e.g., tan $\delta$>10) reflect microwaves with little absorption. Materials with an intermediate loss tangent (e.g., 10≥tan $\delta$≥0.01) can absorb microwave radiation.

DETAILED DESCRIPTION

The conventional annealing technologies used in semiconductor device fabrication, such as rapid thermal annealing (RTA) or millisecond thermal annealing (MSA), often have some disadvantages. For example, a substrate used for device fabrication often includes various device patterns (e.g., through deposition, lithography and/or etching). These different patterns usually correspond to different thicknesses and material types which result in different heat emissivity. During an annealing process (e.g., RTA), different regions on the substrate often absorb and emit different amounts of heat, which results in localized temperature non-uniformity on the substrate. Furthermore, photons of light sources (e.g., lamps used for RTA or lasers used for laser annealing) may not penetrate beyond surface regions of the substrate, which often causes uneven heating of the substrate at different depths. In addition, local temperatures of the substrate during the annealing process is often not monitored or well controlled.

Figure 1:
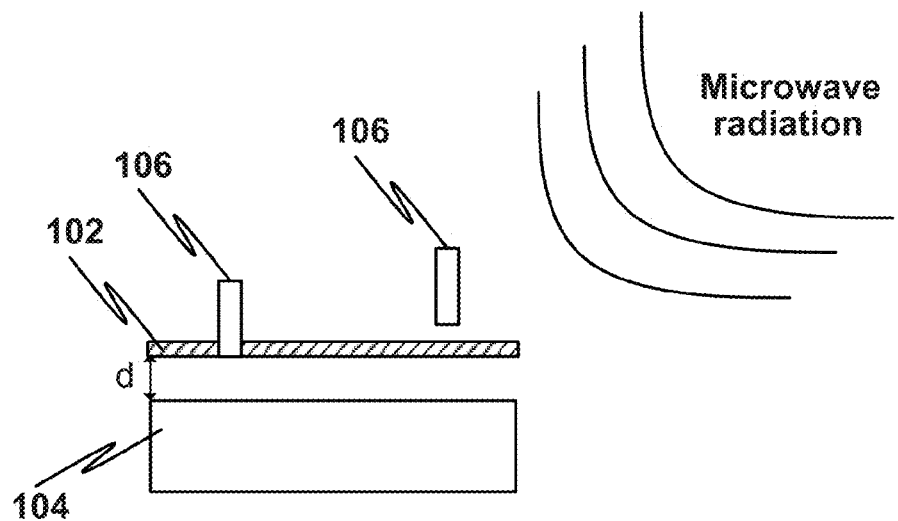
FIG. 1 depicts an example diagram for annealing a semiconductor structure using microwave radiation.

FIG. 1 depicts an example diagram for annealing a semiconductor structure using microwave radiation. As shown in FIG. 1, an energy-converting material 102 is placed at a distance (e.g., d) from a semiconductor structure 104. Microwave radiation is applied to both the energy-converting material 102 and the semiconductor structure 104 to anneal the semiconductor structure 104. One or more thermal detectors 106 are disposed above the semiconductor structure 104 to detect local temperatures of one or more zones of the semiconductor structure 104. The microwave radiation is adjusted to keep the local temperatures within a proper range.

Specifically, the semiconductor structure 104 may include one or more device features, such as epitaxial junctions, implant regions, dielectric layers, and metal materials. For example, the semiconductor structure 104 includes a junction with a number of dopants formed on a substrate at an elevated temperature (e.g., in a range of about 300° C. to about 600° C.) by epitaxial growth. The microwave radiation is applied to anneal the semiconductor structure 104 for dopant activation. The energy-converting material 102 absorbs sufficient microwave radiation and increases an alternating electric field density over the semiconductor structure 104. At the increased electric field density, more and more dipoles related to the dopants are formed on defects in the semiconductor structure 104, and these dipoles vibrate and/or rotate in response to the applied microwave radiation. Once the alternating electric field density over the semiconductor structure 104 exceeds a threshold, the dipole formation and the dipole motions (e.g., vibration and/or rotation) break down the bonds between the crystal lattice (e.g., silicon) in the semiconductor structure 104, dopant clusters and/or the interstitial sites in the semiconductor structure 104 to activate the dopants. The alternating electric field also reacts with interface dipoles through interfacial polarization which builds alternating positive charges and/or negative charges at one or more interfaces, for example, between a high-k dielectric layer and an interfacial layer or between the interfacial layer and a channel layer within a gate structure for a transistor.

The distance (e.g., d) between the energy-converting material 102 and the semiconductor structure 104 may be adjusted to improve dopant activation and/or defects reduction. For example, the distance d is within a range of 0 mm to about 10 mm. The energy-converting material 102 is formed on the semiconductor structure 104 through epitaxial growth, in certain embodiments. The microwave radiation applied to the energy-converting material 102 has a frequency in the range of about 2 GHz to about 10 GHz. For example, the energy-converting material 102 includes n-type doped silicon, hot-pressed silicon carbide, aluminum-coated silicon carbide, silicon-carbide-coated graphite, silicon phosphide, titanium, nickel, silicon nitride, silicon dioxide, or other suitable materials. As an example, the energy-converting material 102 has a larger size than the semiconductor structure 104 so that the electric field density may be approximately uniform over the semiconductor structure 104. The microwave radiation is applied to the energy-converting material 102 and the semiconductor structure 104 for a time period, for example, within a range of about 30 seconds to about 1200 seconds.

In certain embodiments, the local temperatures associated with one or more zones of the semiconductor structure 104 are monitored and controlled in real time so that the local temperatures are kept within the proper range (e.g., about 900° C.~about 1250° C.). For example, if the local temperatures drop below a lower limit of the range, the dopants may not be activated for insufficient energy. In another example, if the local temperatures exceed an upper limit of the range, the undesirable dopant diffusion may occur. The thermal detectors 106 include one or more pyrometers, or other suitable temperature-measurement devices. The thermal detectors 106 each include a small area (e.g., in microns) for radiation collection to detect local temperatures. The thermal detectors 106 include lens specifically designed to detect radiation associated with a shallow depth within a range of about 5 nm to about 20 nm. A response time of the thermal detectors 106 is within a range of about 1 μs to about 1 ms. For example, the thermal detectors 106 are disposed above or below the energy-converting material 102. In another example, the thermal detectors 106 are disposed in one or more pinholes in the energy-converting materials 102. In some embodiments, the local temperatures associated with one or more zones of the semiconductor structure 104 are transient (e.g., lasting about milliseconds or sub-milliseconds), because the entire wafer acts as a heat sink.

In some embodiments, the semiconductor structure 104 has low microwave radiation absorption, and thus effective dopant activation is not easy to achieve. For example, a junction included in the semiconductor structure 104 has a small number of defects which often lead to insufficient dipole formation within the junction to interact with the microwave radiation for dopant activation. Pre-amorphization implantation (PAI) may be performed on the semiconductor structure 104 to increase microwave-radiation absorption for dopant activation. For example, before the dopants are introduced into the semiconductor structure 104, PAI is performed (e.g., using a plasma doping technique) to inject certain implantation species (e.g., ions) into the semiconductor structure 104. In response, a pre-amorphization layer is formed in the semiconductor structure 104. As an example, the pre-amorphization layer contains a large amount of defects as a result of the implantation. After the PAI process, dopants are introduced into the semiconductor structure 104, e.g., through implantation or epitaxial growth. When the microwave radiation is applied, the semiconductor structure 104 undergoes solid-phase epitaxial re-growth in response to the microwave radiation. The microwave-radiation absorption of the semiconductor structure 104 is increased because of the large amount of defects generated during the PAI process. More dipoles related to the dopants are formed in the semiconductor structure 104, and these dipoles vibrate and/or rotate in response to the applied microwave radiation for dopant activation.

Figure 2:
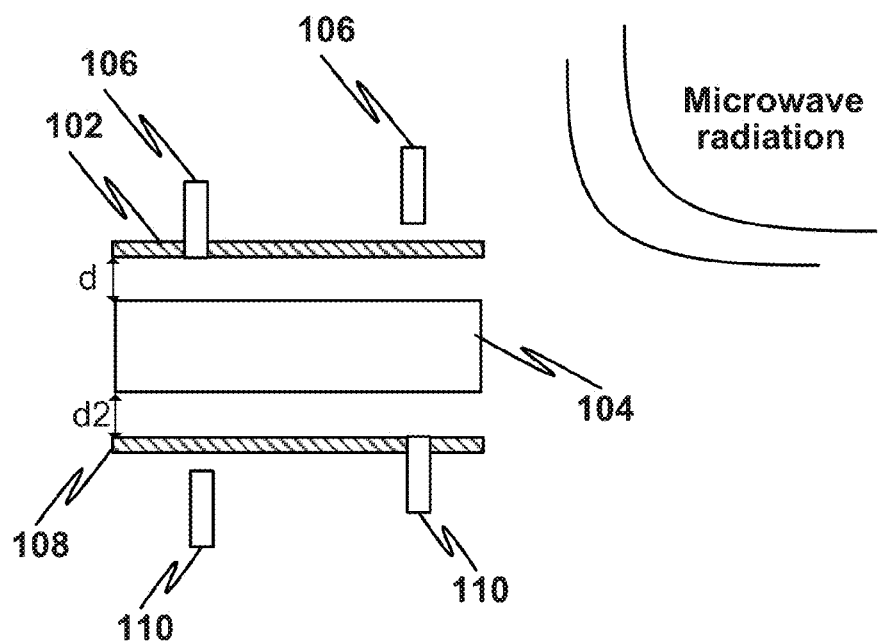
FIG. 2 depicts another example diagram showing annealing a semiconductor structure using microwave radiation.

FIG. 2 depicts another example diagram showing annealing a semiconductor structure using microwave radiation. As shown in FIG. 2, the energy-converting material 102 is placed at a distance (e.g., d) above the semiconductor structure 104, and in addition, another energy-converting material 108 is placed at a distance (e.g., d2) below the semiconductor structure 104. Microwave radiation is applied to the semiconductor structure 104 and the energy-converting materials 102 and 108 to anneal the semiconductor structure 104. The thermal detectors 106 are disposed above the semiconductor structure 104 to detect local temperatures of one or more first zones of the semiconductor structure 104. One or more thermal detectors 110 are disposed below the semiconductor structure 104 to detect local temperatures of one or more second zones of the semiconductor structure 104. The microwave radiation is adjusted to keep the local temperatures of the first zones within a first range, and keep the local temperatures of the second zones within a second range.

Specifically, the thermal detectors 110 detect the local temperatures of the one or more second zones that correspond to certain regions in the substrate of the semiconductor structure 104. These local temperatures represent the interaction between the microwave radiation and free carriers in the substrate. The local temperatures associated with the one or more second zones are monitored and controlled in real time so that these local temperatures are kept within the second range. For example, the second range centers around a target temperature and includes from about 1° C. below the target temperature to about 1° C. over the target temperature. If the local temperatures associated with the second zones are out of the second range, the microwave-radiation annealing may be stopped and the tool for performing the annealing may be interlocked. The target temperature is selected, e.g., within a range of about 300° C. to about 600° C.

The thermal detectors 110 include one or more pyrometers, or other suitable temperature-measurement devices. For example, the thermal detectors 110 are disposed above or below the energy-converting material 108. In another example, the thermal detectors 110 are disposed in one or more pinholes in the energy-converting material 108. The energy-converting material 108 includes n-type doped silicon, hot-pressed silicon carbide, aluminum-coated silicon carbide, silicon phosphide, silicon-carbide-coated graphite, titanium, nickel, silicon nitride, silicon dioxide, or other suitable materials. In some embodiments, multiple energy-converting materials are placed above the top surface, below the bottom surface, and over one or more side surfaces of the semiconductor structure 104. The distance (e.g., d2) between the energy-converting material 110 and the semiconductor structure 104 may be adjusted to improve dopant activation and/or defects reduction. For example, the distance d2 is within a range of 0 mm to about 10 mm.

Figure 3:
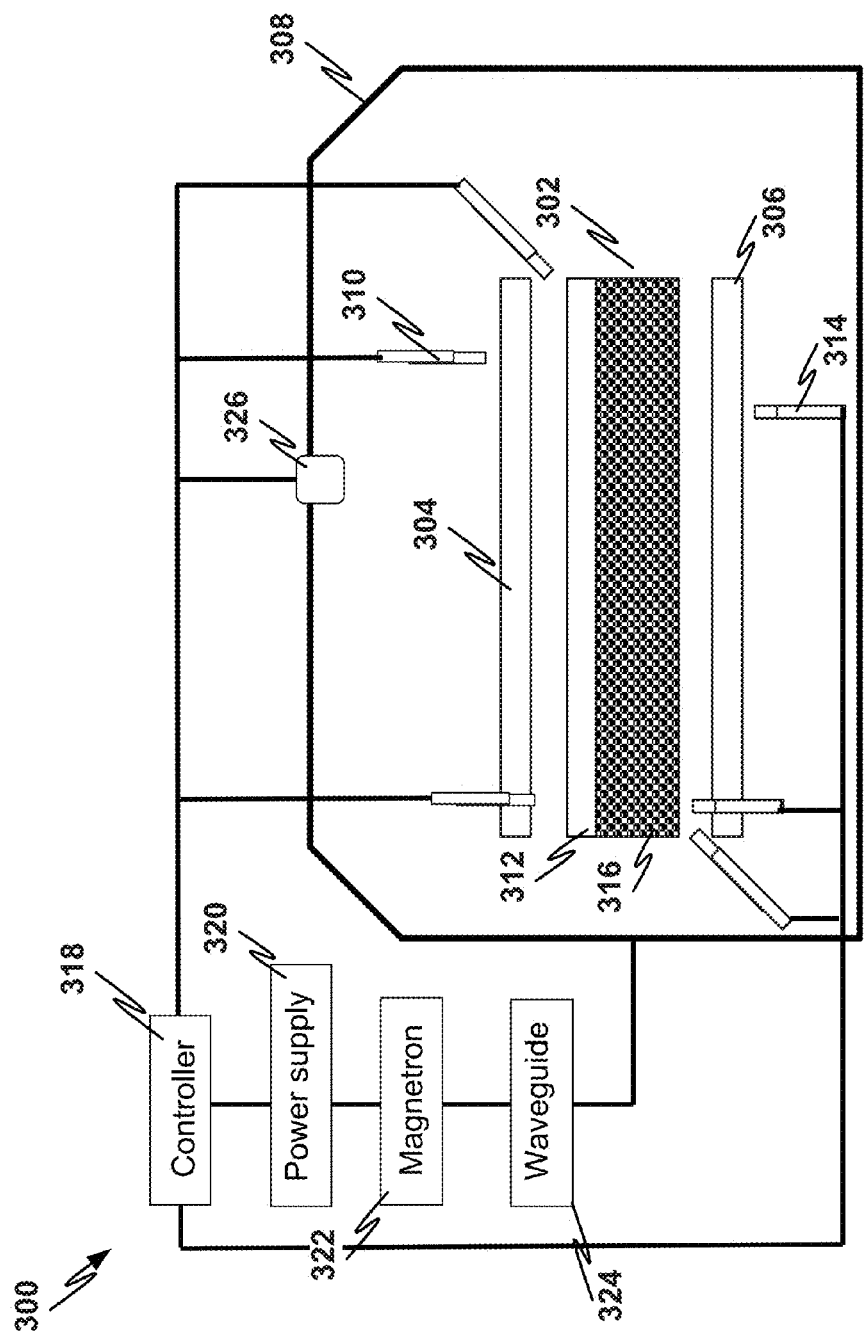
FIG. 3 depicts an example diagram of a system for annealing a semiconductor structure using microwave radiation.

FIG. 3 depicts an example diagram of a system for annealing a semiconductor structure using microwave radiation. As shown in FIG. 3, a semiconductor structure 302 is placed between two energy-converting materials 304 and 306 within a shell 308 (e.g., a metal shell), and microwave radiation is introduced into the shell 308 for annealing the semiconductor structure 302. One or more first thermal detectors 310 are disposed to detect local temperatures associated with one or more first zones in a top portion 312 of the semiconductor structure 302. In addition, one or more second thermal detectors 314 are disposed to detect local temperatures associated with one or more second zones in a bottom portion 316 of the semiconductor structure 302. A controller 318 is configured to adjust the microwave radiation based on the detected local temperatures so that these local temperatures can be kept within proper ranges.

Specifically, the controller 318 controls a power supply 320 that provides power to a microwave source 322. Microwave radiation generated by the microwave source 322 is introduced into the shell 308 through one or more waveguides 324. For example, the microwave source 322 includes a magnetron, a traveling-wave-tube amplifier, a gyrotron, a klystron tube source, or other suitable sources. Through an oxygen sensor 326, the controller 318 is configured to maintain an ambient flow (e.g., nitrogen) that includes less than 10 ppm oxygen.

For example, the thermal detectors 310 are disposed above or below the energy-converting material 304. In another example, the thermal detectors 310 are disposed in one or more pinholes in the energy-converting materials 304. In yet another example, the thermal detectors 310 are disposed at different angles relative to the semiconductor structure 302 to measure local temperatures of different zones (e.g., a center area and/or an edge area of the semiconductor structure 302). The top portion 312 includes one or more device features, such as epitaxial junctions, implant regions, dielectric layers, and metal materials. The local temperatures associated with the first zones in the top portion 312 are related to the interaction between the microwave radiation and defects in the top portion 312. As an example, the thermal detectors 314 are disposed above or below the energy-converting material 306. In another example, the thermal detectors 314 are disposed in one or more pinholes in the energy-converting materials 306. In yet another example, the thermal detectors 314 are disposed at different angles relative to the semiconductor structure 302. The bottom portion 316 includes a substrate, and the local temperatures associated with the second zones in the bottom portion 316 are related to the interaction between the microwave radiation and free carriers in the bottom portion 316.

Figure 4:
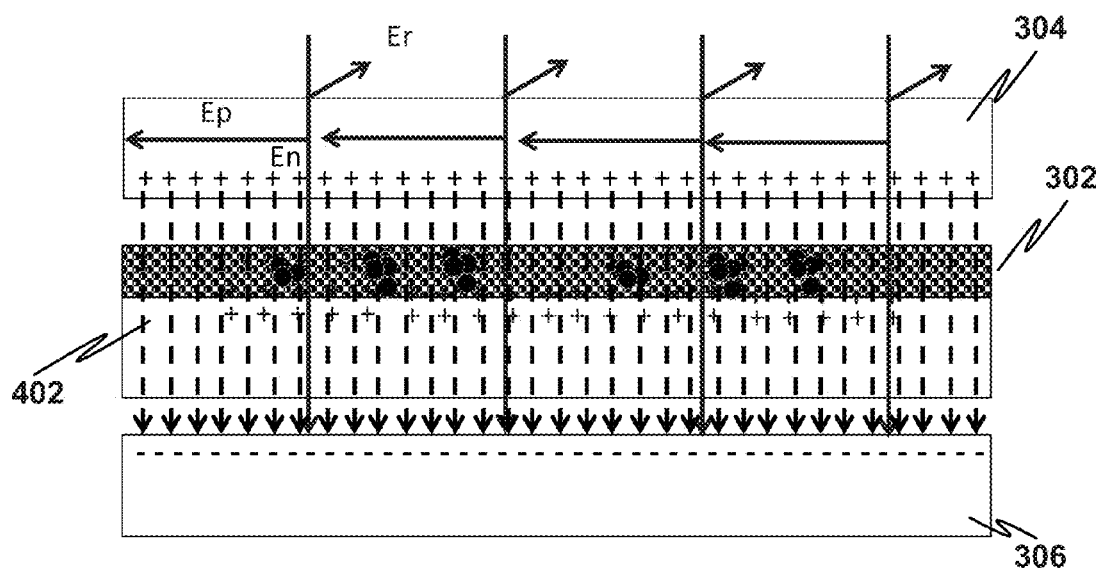
FIG. 4 depicts an example diagram showing energy-converting materials providing a conduction field.

FIG. 4 depicts an example diagram showing the energy-converting materials 304 and 306 providing a conduction field. As shown in FIG. 4, the energy-converting materials 304 and 306 absorb sufficient microwave radiation at a proper temperature and provide a conduction field 402 over the semiconductor structure 302, e.g., to enhance interfacial polarization.

Specifically, an alternating electric field associated with the microwave radiation includes three components: $E_p$, $E_n$ and $E_r$, where $E_n$ penetrates the semiconductor structure 302. In response to the alternating electric field (e.g., particularly the component $E_p$), positive charges begin to build close to a bottom surface of the energy-converting material 304, and negative charges begin to build close to a top surface of the energy-converting material 306. At a proper temperature (e.g., within a range of about 500° C. to about 700° C.), sufficient charges have built up in the energy-converting materials 304 and 306, which results in a corresponding conduction field 402 that penetrates the semiconductor structure 302 and enhances the interfacial polarization in the semiconductor structure 302.

In some embodiments, at a temperature within a range of room temperature to about 300° C., the alternating electric field interacts mainly with extrinsic dopants in the semiconductor structure 302 and volumetric heating occurs for annealing the semiconductor structure 302. At a temperature within a range of about 300° C. to about 500° C., the alternating electric field interacts mainly with intrinsic atoms (e.g., silicon) in the semiconductor structure 302 and the semiconductor structure 302 is annealed through volumetric heating. At a temperature within a range of about 500° C. to about 700° C., the conduction field 402 becomes intensified. For example, more and more dipoles related to the dopants are formed in the semiconductor structure 302, and these dipoles vibrate and/or rotate in response to the conduction field 402 in addition to the alternating electric field. The dipole formation and the dipole motions (e.g., vibration and/or rotation) eventually break down the bonds between the dopants and the interstitial sites in the semiconductor structure 302 to activate the dopants.

Figure 5:
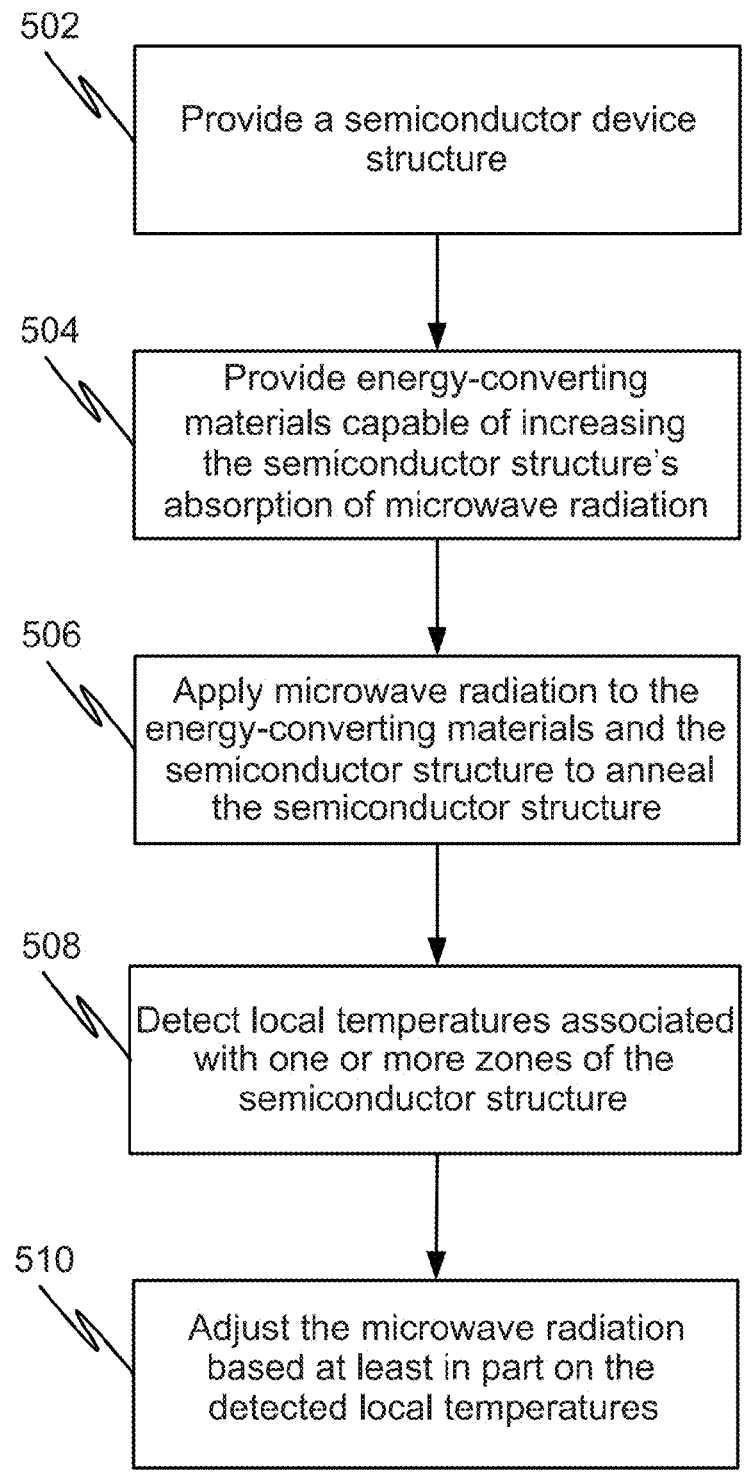
FIG. 5 depicts an example diagram showing a flow chart for annealing a semiconductor structure using microwave radiation.

FIG. 5 depicts an example diagram showing a flow chart for annealing a semiconductor structure using microwave radiation. At 502, a semiconductor structure is provided. At 504, one or more energy-converting materials capable of increasing the semiconductor structure's absorption of microwave radiation are provided. At 506, microwave radiation is applied to the energy-converting materials and the semiconductor structure to anneal the semiconductor structure for fabricating semiconductor devices. At 508, first local temperatures associated with one or more first zones of the semiconductor structure are detected. At 510, the microwave radiation applied to the energy-converting materials and the semiconductor structure is adjusted based at least in part on the detected first local temperatures.

Figure 6:
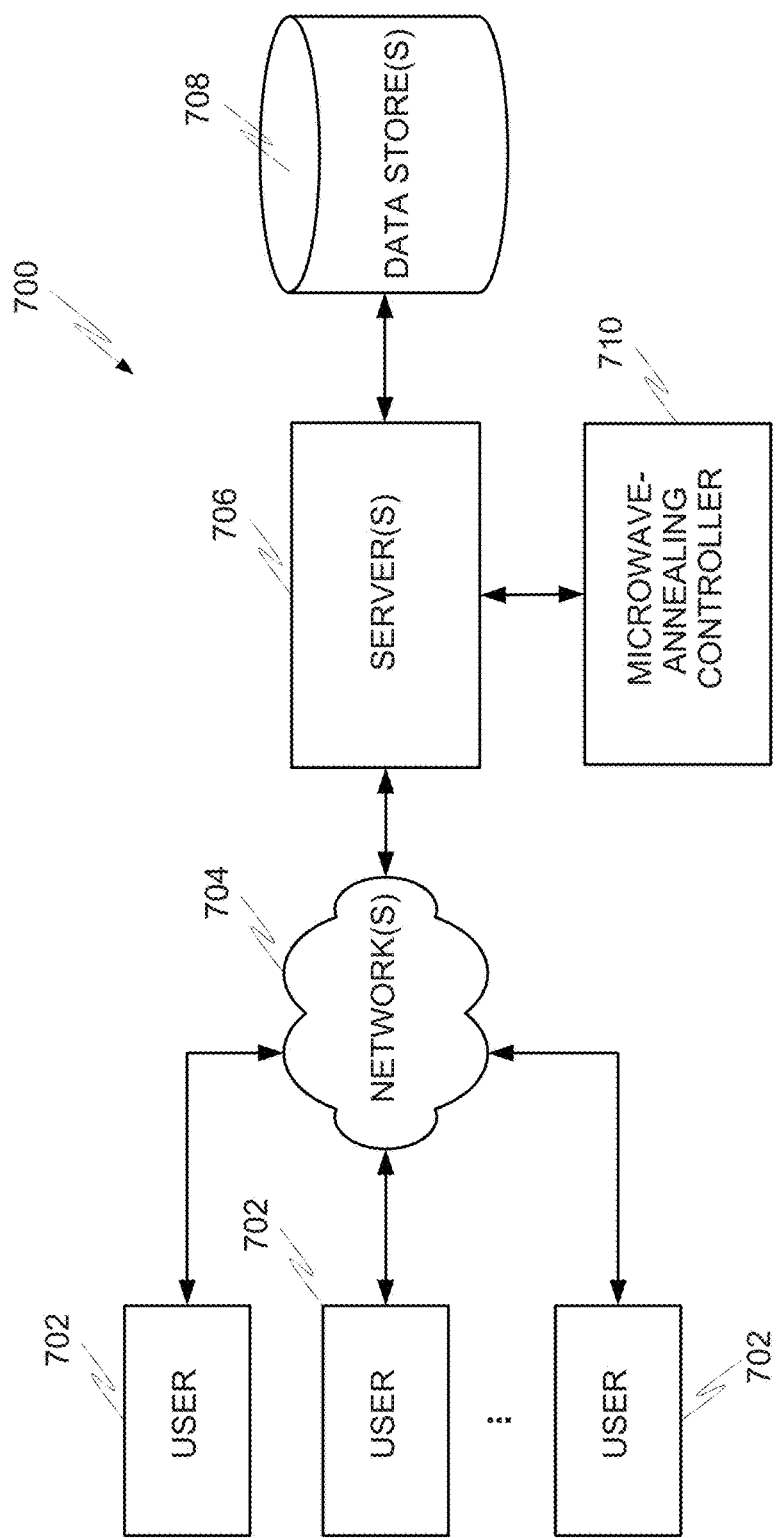
FIG. 6 illustrates an example of a computer-implemented environment wherein users can interact with a microwave-annealing controller hosted on one or more servers through a network.

FIG. 6 illustrates an example of a computer-implemented environment wherein users 702 can interact with a microwave-annealing controller 710 hosted on one or more servers 706 through a network 704. The microwave-annealing controller 710 can assist the users 702 to perform annealing of a semiconductor structure using microwave radiation. Specifically, the microwave-annealing controller 710 is implemented to apply microwave radiation to one or more energy-converting materials and the semiconductor structure to anneal the semiconductor structure for fabricating semiconductor devices. The one or more energy-converting materials are capable of increasing a semiconductor structure's absorption of microwave radiation. The microwave-annealing controller 710 is configured to adjust the microwave radiation applied to the energy-converting materials and the semiconductor structure based at least in part on local temperatures associated with one or more zones in the semiconductor structure.

Figure 7:
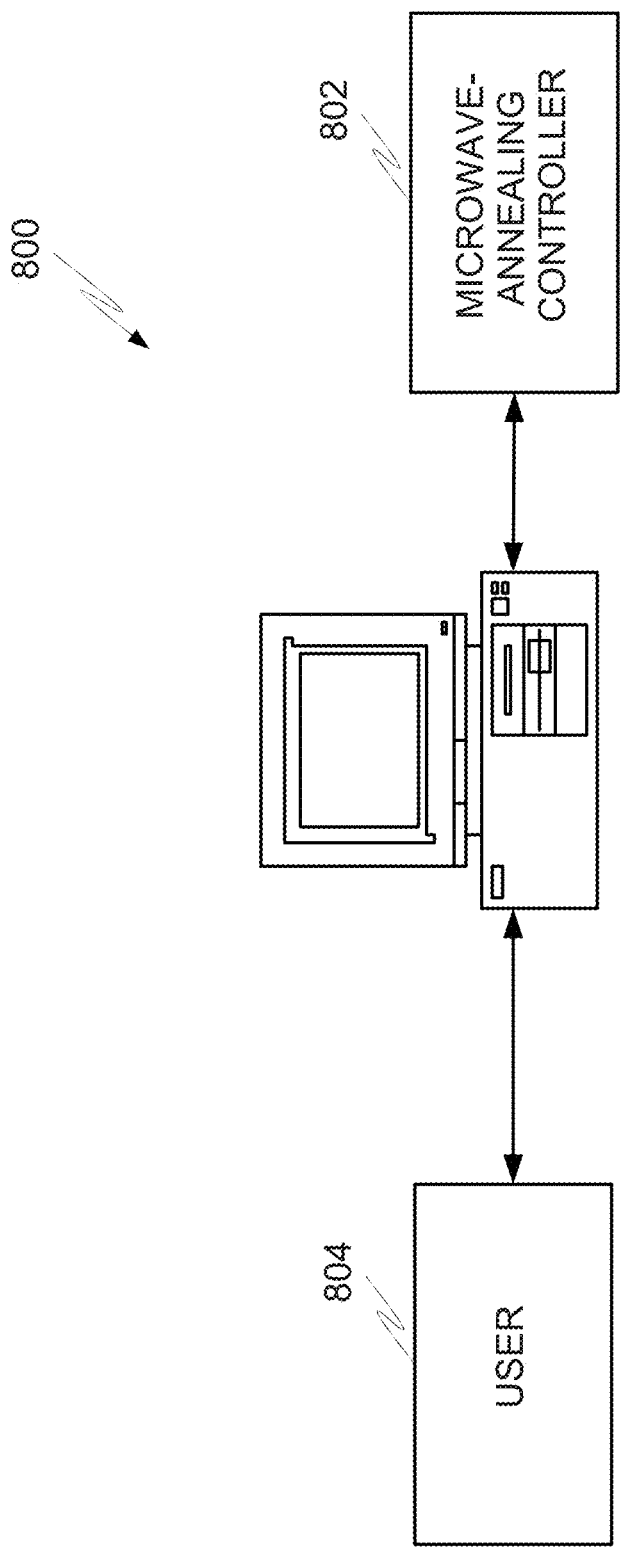
FIG. 7 depicts an example of a microwave-annealing controller provided on a stand-alone computer for access by a user.

As shown in FIG. 6, the users 702 can interact with the microwave-annealing controller 710 through a number of ways, such as over one or more networks 704. One or more servers 706 accessible through the network(s) 704 can host the microwave-annealing controller 710. The one or more servers 706 can also contain or have access to one or more data stores 708 for storing data for the microwave-annealing controller 710. In some embodiments, the data stores 708 includes a database storing local temperatures of different zones in the semiconductor structure, and the microwave-annealing controller 710 queries the database to determine whether the local temperatures are within a proper range. In some embodiments, a computer-implemented system and method can be configured such that a microwave-annealing controller 802 can be provided on a stand-alone computer for access by a user, such as shown at 800 in FIG. 7.

According to one embodiment, a method is provided for annealing a semiconductor structure using microwave radiation. A semiconductor structure is provided. One or more energy-converting materials capable of increasing the semiconductor structure's absorption of microwave radiation are provided. Microwave radiation is applied to the energy-converting materials and the semiconductor structure to anneal the semiconductor structure for fabricating semiconductor devices. First local temperatures associated with one or more first zones of the semiconductor structure are detected. The microwave radiation applied to the energy-converting materials and the semiconductor structure is adjusted based at least in part on the detected first local temperatures.

According to another embodiment, a system for annealing a semiconductor structure using microwave radiation includes: one or more energy-converting materials capable of increasing a semiconductor structure's absorption of microwave radiation, a controller configured to apply microwave radiation to the energy-converting materials and the semiconductor structure to anneal the semiconductor structure for fabricating semiconductor devices, and one or more first thermal detectors configured to detect first local temperatures associated with one or more first zones of the semiconductor structure. The controller is further configured to adjust the microwave radiation applied to the energy-converting materials and the semiconductor structure based at least in part on the detected first local temperatures.

According to yet another embodiment, a system for annealing a semiconductor structure using microwave radiation includes: one or more data processors; and a computer-readable memory encoded with programming instructions for commanding the one or more data processors to perform certain operations. Microwave radiation is applied to one or more energy-converting materials and a semiconductor structure to anneal the semiconductor structure for fabricating semiconductor devices, the one or more energy-converting materials being capable of increasing the semiconductor structure's absorption of the microwave radiation. Local temperatures associated with one or more zones of the semiconductor structure are detected. The microwave radiation applied to the energy-converting materials and the semiconductor structure is adjusted based at least in part on the detected local temperatures.

This written description and the following claims may include terms used for descriptive purposes only and are not to be construed as limiting. For example, the term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may include a semiconductor substrate. The term "semiconductor structure" used herein (including in the claims) may also include shallow trench isolation features, poly-silicon gates, lightly doped drain regions, doped wells, contacts, vias, metal lines, or other types of circuit patterns or features to be formed on a semiconductor substrate. In addition, the term "semiconductor structure" used herein (including in the claims) may include various semiconductor devices, including transistors, capacitors, diodes, etc.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what may be claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments have been described. Other embodiments are within the scope of the following claims. For example, the actions recited in the claims can be performed in a different order and still achieve desirable results.

What is claimed is:

1. A system for annealing a semiconductor structure using microwave radiation, the semiconductor structure including a top portion and a bottom portion, the system comprising:
    one or more energy-converting materials capable of increasing a semiconductor structure's absorption of microwave radiation;
    a controller configured to apply microwave radiation to the energy-converting materials and the semiconductor structure to anneal the semiconductor structure for fabricating semiconductor devices; and
    one or more thermal detectors configured to (i) detect first local temperatures associated with one or more first zones of the semiconductor structure, the one or more first zones being disposed in a top portion of the semiconductor structure, and (ii) detect second local temperatures associated with one or more second zones of the semiconductor structure, the one or more second zones being disposed in a bottom portion of the semiconductor structure, and
    wherein the controller is further configured to adjust the microwave radiation applied to the energy-converting materials and the semiconductor structure based at least in part on the first local temperatures and the second local temperatures that are detected by the one or more thermal detectors, wherein the controller is further configured to maintain an ambient control flow including less than 10 ppm oxygen.

2. The system of claim 1, wherein the thermal detectors include one or more pyrometers.

3. The system of claim 1, wherein the thermal detectors are disposed at different angles for detecting the first and second local temperatures.

4. The system of claim 1, further comprising: a microwave-radiation source including a magnetron, a traveling-wave-tube amplifier, a gyrotron, or a klystron tube source.

5. The system of claim 1, wherein the energy-converting materials include n-type doped silicon, hot-pressed silicon carbide, aluminum-coated silicon carbide, silicon-carbide-coated graphite, silicon phosphide, titanium, nickel, silicon nitride, or silicon dioxide.

6. The system of claim 1, wherein the thermal detectors are disposed within the energy-converting materials.

7. The system of claim 1, wherein the energy-converting materials comprise a first energy-converting material disposed above the semiconductor structure and a second energy-converting material disposed below the semiconductor structure.

8. The system of claim 1, wherein the energy-converting materials are formed on the semiconductor structure.

9. The system of claim 1, wherein the one or more energy-converting materials includes a first energy converting material layer,
    wherein the one or more thermal detectors includes a first thermal detector and a second thermal detector,
    wherein the first thermal detector is disposed over the first energy converting material layer and the second thermal detector extends completely through the first energy converting material layer, and
    wherein the first energy converting material layer is disposed over the semiconductor structure such that the first energy converting material layer is disposed between the first thermal detector and the semiconductor structure.

10. A system for annealing a semiconductor structure using microwave radiation, the system comprising:
    one or more data processors; and
    a non-transitory computer-readable medium containing computer instructions stored therein for commanding the one or more data processors to perform operations including:
        applying microwave radiation to one or more energy-converting materials and a semiconductor structure to anneal the semiconductor structure for fabricating semiconductor devices, the one or more energy-converting materials being capable of increasing the semiconductor structure's absorption of the microwave radiation, wherein the one or more energy-converting materials are spaced apart from the semiconductor structure;
        detecting first local temperatures associated with one or more first zones of the semiconductor structure;
        detecting second local temperatures associated with one or more second zones of the semiconductor structure; and
        adjusting the microwave radiation applied to the energy-converting materials and the semiconductor structure based at least in part on the detected first and second local temperatures.

11. The system of claim 10, wherein the one or more first zones are disposed in a top portion of the semiconductor structure, and the one or more second zones are disposed in a bottom portion of the semiconductor structure.

12. The system of claim 10, wherein the thermal detectors are disposed at different angles for detecting the first and second local temperatures.

13. The system of claim 10, wherein the one or more processors are further configured to maintain an ambient control flow including less than 10 ppm oxygen.

14. The system of claim 10, wherein the energy-converting materials comprise a first energy-converting material disposed above the semiconductor structure and a second energy-converting material disposed below the semiconductor structure.

15. The system of claim 10, wherein the energy-converting materials are disposed on the semiconductor structure.

16. A method for annealing a semiconductor structure using microwave radiation, the method comprising:
  applying microwave radiation to one or more energy-converting materials and a semiconductor structure using a controller, the one or more energy-converting materials being capable of increasing the semiconductor structure's absorption of microwave radiation;
  detecting first local temperatures associated with one or more first zones of the semiconductor structure using one or more thermal detectors, the one or more first zones being disposed in a top portion of the semiconductor structure;
  detecting second local temperatures associated with one or more second zones of the semiconductor structure using the one or more thermal detectors, the one or more second zones being disposed in a bottom portion of the semiconductor structure; and
  adjusting the microwave radiation applied to the one or more energy-converting materials and the semiconductor structure using the controller, wherein the microwave radiation is adjusted based at least in part on the first local temperatures and the second local temperatures that are detected by the one or more thermal detectors, wherein at least one of the one or more thermal detectors extends completely through at least one of the one or more energy-converting materials.

17. The method of claim 16, wherein the microwave radiation is adjusted to keep the first and second local temperatures within respective targeted ranges.

18. The method of claim 16, wherein the controller is further configured to maintain an ambient control flow including less than 10 ppm oxygen.

19. The method of claim 16, wherein the one or more energy-converting materials comprise a first energy-converting material disposed above the semiconductor structure and a second energy-converting material disposed below the semiconductor structure.

20. The method of claim 16, wherein the microwave radiation has a frequency within a range of approximately 2 GHz to approximately 10 GHz.

* * * * *